March 10, 1953 J. W. LOWER 2,631,239

AUTOMATIC FREQUENCY CONTROL SYSTEM

Filed Feb. 1, 1950 2 SHEETS—SHEET 1

Inventor:
Jack W. Lower
By: Alois W. Graf
Attorney

March 10, 1953 J. W. LOWER 2,631,239

AUTOMATIC FREQUENCY CONTROL SYSTEM

Filed Feb. 1, 1950 2 SHEETS—SHEET 2

Inventor:
Jack W. Lower
By: Alois W. Graf
Attorney.

Patented Mar. 10, 1953 2,631,239

UNITED STATES PATENT OFFICE 2,631,239

AUTOMATIC FREQUENCY CONTROL SYSTEM

Jack Wesley Lower, Minneapolis, Minn.

Application February 1, 1950, Serial No. 141,820

11 Claims. (Cl. 250—36)

The present invention relates to automatic frequency control systems, and more particularly to a frequency control servomechanism of particular advantage in high frequency heating applications.

In the operation of high frequency heating devices the changing load on the equipment changes the impedance of the oscillator or source of high frequency. This change in the impedance load brings about an appreciable detuning of the resonant circuit or change of the frequency produced by the apparatus. This change in frequency has two distinct disadvantages, the one being the loss of efficiency where the load impedance no longer matches the original load designed for the oscillator or amplifier, and the other is the detrimental effect produced by the frequency excursion outside of the normal frequency range allotted by the Federal Communications Commission to equipment of this type. As the use of high frequency equipment for heating applications has increased, the problem of these frequency excursions interfering with other high frequency services has become all the more noticeable so that very definite limits have been established by the Federal Communications Commission for the operation of high frequency apparatus.

In the construction of high frequency heating equipment, the problem of intermittently or constantly changing load conditions has long been recognized so that numerous devices have been provided in the art, such as producing a load matching by successive switching arrangements, extensive shielding and filtering systems, and means to control the reactance of the tank circuit of the power oscillator.

Heretofore, it has been proposed to employ discriminator circuits to serve as a frequency deviation sensing device whereby the resultant signal has been utilized to control a reactance tube in the power oscillator tuned circuit. Such system has the disadvantage of having a relatively narrow control range and to provide an appreciable reduction requires a reactance tube having a power rating substantially equal to that of the oscillator tube itself.

In another system, a low pass filter circuit is utilized as a sensing device to convert frequency deviation into an error indication. This error indication is utilized by suitable apparatus to operate a servomotor arranged to re-tune the reactive element of the power oscillator. Such an arrangement encounters the disadvantages of being sensitive to amplitude changes as well as to frequency changes, and the expense involved in the construction of surplus circuits is quite objectionable. Such filter circuits, furthermore, require critical adjustment for original alignment, and not infrequently it has been found that the stability of such filter circuits is not sufficiently great as to maintain the desired overall operation characteristics.

In another system which employs sensing devices in order to produce successive switching operations in order to match the impedance of a load to the impedance presented by the power oscillator circuit, the efficiency is improved thereby but such arrangement usually is not sufficiently rapid or accurate enough to hold the frequency of the oscillator within the prescribed ranges as required by the Federal Communications Commission.

Still another system utilizes a stabilized circuit having such loading provisions as to tend to keep the frequency within the band limitations prescribed. In such an arrangement, a deviation from a prescribed "Q" factor produces an interruption of the power in the event of excessive frequency drifts. Such interruption of power actuates a signal which requires the attention of an operator to retune the system.

It, therefore, becomes apparent that it would be highly desirable to provide some arrangement whereby the power oscillator of a high frequency heating system is so controlled as to maintain the frequency of operation well within the assigned frequency band. In accordance with the present system, it is proposed to compare the actual operating frequency of a power oscillator with the frequency of a standard crystal oscillator set to operate at the allocated frequency. An arrangement is provided for regularly sweeping through a range of frequencies, both below and above the allocated frequency range to determine whether any change of frequency has extended beyond the assigned range of frequencies. Two frequency responsive devices are provided which respond to excessively low frequency or excessively high frequency to control a servo amplifier and motor to retune a reactive element of the power oscillator circuit. Such operation, therefore, is entirely automatic and it is possible to provide a sufficiently accurate control within reasonable economic limits.

It is, therefore, an object of the present invention to provide an improved frequency control system.

A further object of the present invention is to provide a frequency control system which is responsive only to frequency differences without regard to amplitude variations.

A still further object of the present invention is to provide an improved frequency control system having a relatively wide control range.

A still further object of the present invention is to provide an improved frequency control system for translating frequency differences into time elements.

A still further object of the present invention is to provide an improved frequency control system for translating frequency differences into a control potential of constant magnitude having a sign or direction dependent upon whether the frequency difference is above or below a certain frequency or frequency band.

Still another object of the present invention is to provide an improved frequency control system, particularly suited for controlling high frequency heating oscillators.

Still another object of the present invention is to provide an improved frequency responsive servo-control system.

Other and further objects of the present invention subsequently will become apparent by reference to the accompanying drawings taken in conjunction with the following specifications.

Figure 1:
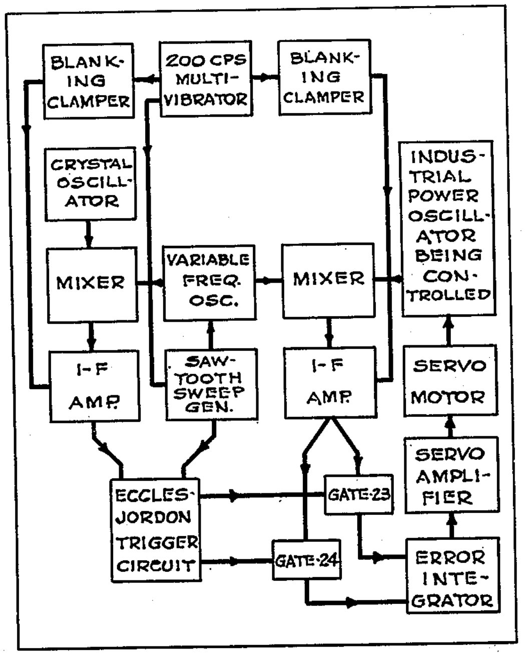
Figure 1 is a block diagram showing the various components comprising the automatic frequency control system of this present invention.

The block diagram of Figure 1 illustrates the automatic frequency control system as applied to the industrial power oscillator. At the center of the top of Figure 1 there is indicated a free-running asymmetric multivibrator which in one embodiment had an unbalanced ratio of 7:1 and a frequency of 200 C. P. S. The leading edge of the wave representing the shorter period of the multivibrator is delayed slightly for synchronization purposes. A portion of the output of the multivibrator is fed to control a saw-toothed sweep generator which controls a variable-frequency oscillator. The saw-tooth generator also supplies voltage to a flip-flop circuit generally characterized by the Eccles-Jordan circuit. Energy from the multivibrator is also supplied to two blanking clampers which respectively control the amplification of two intermediate frequency amplifiers.

The variable frequency oscillator supplies energy to two mixers operating in the manner of heterodyne detectors or frequency modulation devices. One of the mixer or heterodyne tube circuits is also supplied with energy from a crystal-controlled oscillator having an output frequency located in the center of the assigned band of operation for the industrial power oscillator. The heterodyned energy or frequency modulated energy is then fed to the intermediate frequency amplifier which is controlled by the blanking clamper. The output of this intermediate frequency amplifier is rectified so as to provide a trigger pulse for the Eccles-Jordan flip-flop circuit. It will be recalled that the flip-flop circuit is triggered by a pulse derived from the saw-tooth sweep generator. The intermediate frequency amplifier receiving heterodyne energy from the crystal oscillator and the variable frequency oscillator provides an additional pulse which serves to trigger the flip-flop circuit to the opposite mode of operation. The flip-flop circuit supplies, generally, a rectangular pulse energy to two circuits identified as gate 23 and gate 24.

The gate circuits are of the coincidence mixer type where each tube has its suppressor grid connected to the output of the flip-flop circuit. In order to render a gate circuit conductive, it is necessary to have the proper relation between a positive signal from the flip-flop circuit and a pulse from the intermediate frequency amplifier connected to the mixer associated with the industrial power oscillator. It will be noted that the other mixer or heterodyne circuit supplies energy to an intermediate frequency amplifier which, in turn, is connected to each of the gate circuits. The two gate circuits are connected to an error integrator which is a pulse integrating detector circuit containing a capacitor charged through a diode by successive increments. The voltage derived from this detector or integrator is continuous for the control of the servo amplifier.

The servo amplifier employs a pair of amplifier tubes which are unbalanced by the error signals to produce a movement of the servomotor in the proper direction. The servomotor operates a variable impedance device to tune the tank circuit of the power oscillator.

Figure 2:
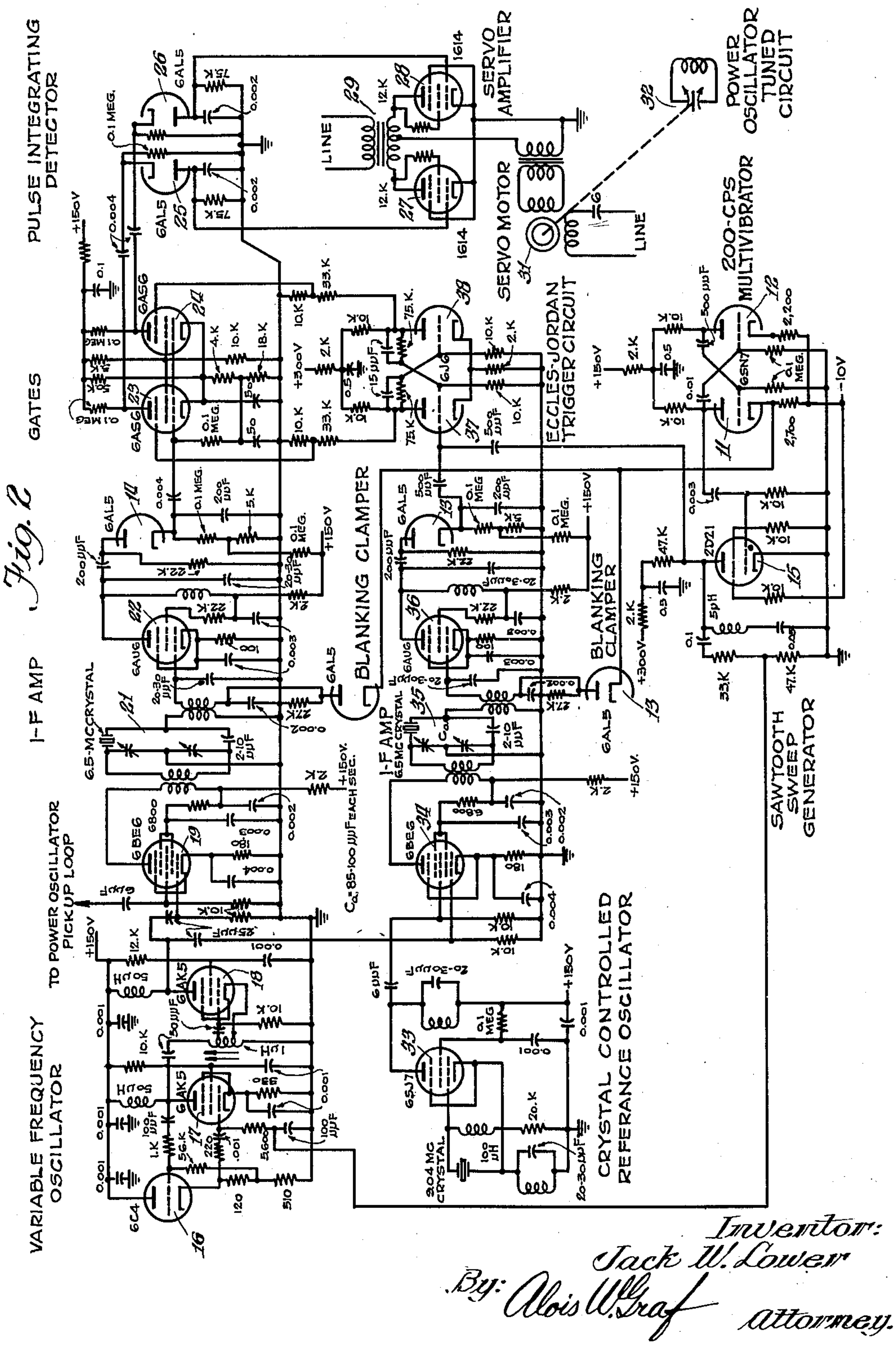
Figure 2 is a circuit diagram corresponding to the block diagram, Figure 1.

The circuit details as illustrated in Fig. 2 show that the multivibrator employs two tubes, 11 and 12, which may be contained within a single envelope such as the 6SN7 tube. The circuit is of conventional design. For a tube of the type mentioned, values have been illustrated for the various components employed in order to more clearly set forth the teaching of applicant's invention. The multivibrator circuit provides an effective blanking period during the sweep retrace of the variable frequency oscillator and at the same time provides delayed synchronization of the saw-tooth sweep generator. Potential from the cathode resistor of the vacuum tube 11 is supplied to the two blanking clamper tubes associated with the two intermediate frequency amplifiers. It will be noted that each blanking clamper consists of a diode which may be one-half of a 6AL5 tube. The other half of each of such tubes is employed in connection with the intermediate frequency amplifier to provide a rectified output therefrom.

The anode of the vacuum tube 11 is coupled by a capacitor to the grid of the saw-tooth sweep generator tube 15. The tube 15, preferably, is of the type containing gas or vapor which may be ionized.

The output of the saw-tooth sweep generator is supplied to the grid-to-cathode circuit of a reactance tube 17. The grid-to-cathode circuit is connected to the cathode follower circuit of a tube 16. The reactance tube 17 controls a variable frequency oscillator circuit containing the tube 18. This variable frequency oscillator has been designed to secure the necessary width of range through which the oscillator is to vary in frequency. The cathode follower buffer employed between the oscillator and the reactance tube serve to provide a reduction in the distributed capacitance. A relatively low distributed capacitance is desirable in order to have a relatively high impedance of the resonance circuit which should have a high $L/C$ ratio. It was also found advantageous to employ an auto-transformer coupling for the reactance tube to reduce reflected impedance.

The output of the variable frequency oscillator is coupled to the control grid of a mixer or heterodyne tube 19. The circuit design for the mixer or heterodyne tube is generally conventional with some additional precautions being taken against circuit inter-action by appropriate location and shielding. One of the other grids of the heterodyning tube 19 is energized by energy received by a pickup loop coupled to the tank, or output circuit of the power oscillator.

The anode of the mixer or modulator tube 19 is connected to a crystal filter circuit 21. This circuit is employed in order to provide the desired degree of selectivity for the intermediate frequency amplifier, which preferably should be as high as is practicable. Since the ultimate accuracy of the system is dependent upon the pulse within the switching time of flip-flop circuit, it was found that conventional $L/C$ filters were not considered satisfactory and hence the crystal filter circuit was employed. It will be noted that this crystal filter circuit is coupled to the heterodyne or mixer tube 19 and to the intermediate frequency amplifier circuit associated with the intermediate frequency amplifier tube 22. The crystal filter circuit comprises a bridge network which does not produce any output until the frequency of the crystal is obtained. The use of a crystal filter produces a stabilization of the intermediate frequency amplifier. By the use of crystal filters for each of the amplifiers, it is possible to produce a better match thereby minimizing any possible difference there may be between the transmission characteristics of the two intermediate frequency amplifiers.

The intermediate frequency amplifier tube 22 has its input circuit so arranged that the blanking signal obtained from the blanking clamper 14 controls the time during which the intermediate frequency amplifier is inoperative. The output of the intermediate frequency amplifier tube 22 is coupled through a capacitor to the diode detector 14, which is provided with sufficient cathode bias to prevent response to noise level.

The output of the intermediate frequency amplifier detector 14 is supplied to the grid of two gating tubes 23 and 24. Each of the tubes 23 and 24 is a coincident mixer control tube which has its suppressor grid controlled by the trigger circuit networks of the flip-flop circuit.

The coincidence mixer tubes or gates have their anodes connected to an integrating detector circuit utilizing two diodes 25 and 26. These two diodes may be contained in a single envelope as indicated in the drawing. The pulses produced by the periodic conduction of the gate tubes 23 and 24 are received by the diodes 25 and 26, to charge capacitors associated with the respective anodes of the diodes. A resistor which is connected in parallel with a capacitor provides a discharge time constant which is several times greater than the time interval between successive pulses, thus a voltage is built up across one of the capacitors to apply a control potential to one of the servo amplifier tubes 27 or 28. The servomotor is mechanically connected to a variable reactance element such as a tuning condenser 32 in the power oscillator circuit. It will be noted that the servo motor 31 in one instance was conveniently found to consist of a two-phase induction motor which has one field constantly excited from the alternating current line.

In order to control the frequency to which the power oscillator is to be tuned there is provided a crystal reference oscillator employing a vacuum tube 33. In one embodiment a conventional Tri-Tet circuit was employed utilizing a 9.04 megacycle crystal in the input circuit and the output circuit of tube 33 was tuned to the third harmonic of 27.12 megacycles.

The output of the crystal controlled oscillator circuit employing vacuum tube 33 is connected to the input circuit of a mixer or heterodyne tube 34.

One of the other grids of the mixer tube 34 also receives energy from the variable frequency oscillator. The two frequencies from the crystal controlled oscillator and from the variable frequency oscillator are heterodyned by the tube 34 which is coupled to a crystal filter circuit 35.

As the frequency of the variable frequency oscillator is varied, the output of tube 34 eventually has a resultant frequency which is transmitted by the intermediate frequency filter circuit 35 to the intermediate frequency amplifier tube 36. The grid-to-cathode circuit of the intermediate frequency amplifier tube 36 is connected to the anode of the blanking clamper tube 13 which periodically renders the amplifier inactive during the retrace period of the variable frequency oscillator.

The output of the intermediate frequency amplifier tube 36 is connected to the detector tube 13, which supplies energy to one of the grids of the flip-flop circuits employing two triode tubes 37 and 38.

The flip-flop circuit employing two tubes 37 and 38 is of the Eccles-Jordan trigger type which will change its mode of conduction in accordance with the energy applied to the grid of the tube 37.

It will be noted that the grid of the tube 37 is energized from the output of the detector tube 13, and also from the saw-tooth sweep generator employing tube 15.

It will be appreciated by those skilled in the art that the present system provides a continuous periodic control of the tuned circuit of the power oscillator. Comparisons are continually made between the output frequency of the power oscillator and the crystal-controlled reference oscillator at the frequency of operation of the multivibrator. Thus, when the multivibrator operates at a frequency of 200 C. P. S. the variable frequency oscillator sweeps through a range of frequency 200 times per second. Thus at some one instant during the time interval of one two-hundredth of a second the mixer tube 19 will have a frequency output which is transmitted and amplified by the intermediate frequency amplifier in tube 22.

During this same time interval, the heterodyne or mixer tube 34 will produce an intermediate frequency pulse which is transmitted and amplified by the intermediate frequency amplifier tube 36. If the frequency of the power oscillator is identical to the frequency of the crystal controlled reference oscillator, both intermediate frequency amplifiers will transmit energy at the same time. If there is a difference in frequency between the power oscillator and the crystal controlled reference oscillator, the time at which the first intermediate frequency employing a tube 22 transmits the signal will be displaced in time either ahead of or behind the instant that the second intermediate amplifier employing a tube 36 transmits its signal.

Figure 3:
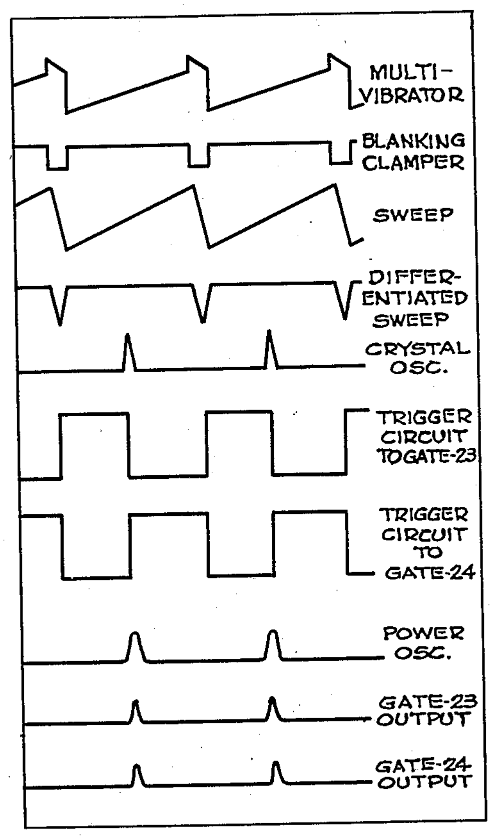
Figure 3 is a graphical representation of the various voltage waves occurring in different portions of the system.

It will be observed from the first curve of Fig. 3 of the drawing that the multivibrator employing the vacuum tubes 11 and 12 produces a periodic or saw-tooth wave which causes the saw-tooth sweep generator to produce a relatively regulator saw-tooth shown in the third curve. During the time that the sweep saw-tooth wave returns to the initial position, the multivibrator has caused the blanking clamper to produce negative rectangular pulses of short duration shown in the second curve so as to block the conductivity of each of intermediate frequency amplifiers. Thus during a comparatively longer interval of time, the variable frequency oscillator passes through its range of operation so as to provide a discreet time interval between the conduction of energy by the two intermediate frequency amplifiers if any frequency difference exists between the frequency of the power oscillator and the frequency of the crystal controlled oscillator.

The sweep retrace wave is differentiated by suitable resistance-capacitance circuits associated with anode of the saw-tooth sweep generator 15, which is coupled through a capacitor to the grid of the flip-flop tube 37. This assures a similar mode of operation for the flip-flop circuit at the start of each sweep of frequency of the variable frequency oscillator. This differentiated wave, or controlled voltage, is illustrated in the fourth curve of Fig. 3. The fifth curve of Fig. 3 shows that as the variable frequency oscillator varies from a frequency below the desired frequency of operation of a power oscillator to an extent equally above the desired frequency of operation, a short transmission pulse occurs when energy is combined with that of the crystal oscillator which is amplified by the intermediate frequency amplifier employing the tube 36. A similar voltage wave is obtained from the other intermediate frequency amplifier, but this voltage wave is displaced in phase or time with respect to the one illustrated with Fig. 3 by an amount dependent upon the frequency deviation of the power oscillator from the desired operating frequency.

The operation provided by the flip-flop circuit to control the conductivities of the gate tubes 23 and 24 becomes apparent by an examination of curves 6 and 7 of Fig. 3. It will be seen that the tube 37 of the flip-flop circuit is non-conductive at the beginning of the frequency sweep of the variable frequency oscillator. During the time that the first tube 37 is non-conductive, the other tube 38 is conductive. While the first tube 37 is non-conductive its anode voltage increases to such level that the voltage applied to the suppressor grid of the gate tube 23 through the dividing network prepares this tube for conduction as soon as a suitable control grid signal is applied. The other tube 38 of the flip-flop circuit being conductive has its anode voltage so lowered that the voltage supplied to the suppressor and grid of the gate tube 24 is insufficient to permit this tube to be conductive in the presence of a control signal on its control grid.

As soon as the intermediate frequency amplifier 36 transmits a signal to the grid of the flip-flop circuit tube 37, the conductivity relation of the tubes 37 and 38 is reversed.

If the frequency of the power oscillator is below the desired frequency, the intermediate frequency amplifier 22 will be provided a signal for the grid of the gate tube 23 prior to the time that the flip-flop circuit mode of operation is reversed. Thus the tube 23 would transmit a pulse to the integrating circuit including the tube 25. If, however, the frequency of the power oscillator is above the desired operating frequency, the energy transmitted by the intermediate frequency amplifier 22 will be applied to the gate circuit subsequent to the reversal of the operation of the flip-flop circuit so that the tube 24 will be conductive and transmit an integrating pulse to the integrating detector tube 26. When the power oscillator frequency is at the desired operating value, the pulse transmitted by the first intermediate frequency amplifier will be applied to the gate tube during the time that the flip-flop circuit is changing its mode of operation so that no energy is supplied to the pulse integrating detector.

The servo amplifier tubes 27 and 28 are supplied with alternating current potential of opposite phase so that with no grid potential applied, the conductivities of the tubes are identical. Any anode current flowing produces a cancellation of the fundamental component so that only the second harmonic is present. As soon as an error signal has been obtained from the pulse integrating detector, one of the tubes—27 or 28—will become conductive so as to supply a fundamental alternating current component to the second motor field. The phase relation of the motor field current supplied by the servo amplifier relative to the phase relation of the other motor field current determines the direction of rotation of the servomotor. In the arrangement shown, a relatively low voltage two-phase motor was employed, although it will be understood that other types of motors can be utilized as is apparent to those skilled in the art.

From the foregoing description of the mode of operation of the system it will be appreciated that any deviation in frequency by the power oscillator from the assigned frequency will result in an error signal of constant magnitude produced by the pulse integrating detector. This signal will continue as long as there is any frequency deviation. The direction of the error signal, that is as to whether it is applied to tube 27 or tube 28 of the servo amplifier, depends upon whether the frequency error is above or below that determined by the crystal controlled oscillator. It also will be appreciated that the present system is responsive only to frequency errors which are translated into a time relationship subsequently converted into a constant magnitude signal for the control of servomotor. In one embodiment for an industrial heating system the power oscillator was maintained within 0.01% of 27.12 megacycles frequency. In the same installation it was also found that step functions of error were corrected at the rate of one megacycle per second, with no oscillatory overshoot exceeding the tolerance permitted by the rules of the Federal Communications Commission.

Figure 4:
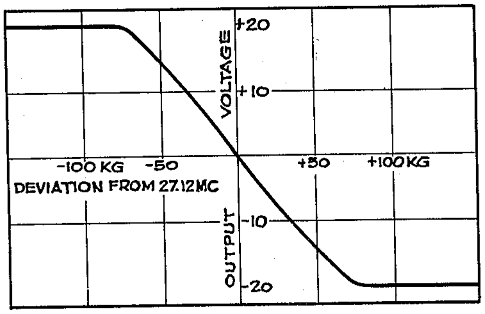
Figure 4 is a graphical representation of the net transducer characteristic for the entire system, showing an error-correcting voltage fed to the servo system.

The graphic representation shown in Fig. 4 of the drawing illustrates the net transducer characteristic for the pulse circuit showing the error correcting voltage supplied to the servo system.

While for the purpose of illustrating the present invention, the system has been shown as being applied to frequency stabilization and dielectric oscillators, it is to be understood that the same principles of invention apply to the application of frequency stabilization or control of other high frequency devices. In order to provide those skilled at the art with a complete understanding of the operation of the system and its construction, typical values have been given for each of the electrical components employed in the circuit arrangement illustrated in Fig. 2 of the drawing. It is to be understood that these values are merely for the purpose of providing a complete comprehensive disclosure of a typical physical embodiment.

For different frequency ranges and different applications of the system, the components employed necesssarily will have different values.

While for the purpose of illustrating and describing the present invention, certain specific components and embodiments have been illustrated in the drawings, it is to be understood that the invention is not to be limited thereby since such variations in the components employed and in the circuit arrangements are contemplated as may be commensurate with the spirit and scope of the invention defined in the accompanying claims.

What I desire to protect by United States Letters Patent is claimed as follows:

1. An automatic frequency control for a power oscillator having a variable impedance tuned circuit comprising a variable frequency oscillator arranged to sweep periodically through a range of frequencies beyond the desired operating frequency of the power oscillator, means for heterodyning energy from said power oscillator with energy from said variable frequency oscillator, means for heterodyning constant frequency energy with energy from said variable frequency oscillator, means for producing pulses from the resultant heterodyned energies and controlling the impedance of said power oscillator tuned circuit in accordance with phase relation of said pulses.

2. An automatic frequency control for a power oscillator having a variable impedance tuned circuit comprising a reference source of frequencies, a variable frequency oscillator arranged to sweep periodically through a range of frequencies below and above the desired operating frequency of the power oscillator, means for heterodyning energy from said power oscillator with energy from said variable frequency oscillator, means for heterodyning energy from said reference source with energy from said variable frequency oscillator, means for comparing the resultant heterodyned energies and controlling the impedance of said power oscillator tuned circuit in accordance with the phase of said energies.

3. An automatic frequency control for a power oscillator having a variable impedance tuned circuit comprising a variable frequency oscillator arranged to sweep a band of frequency from below to above the assigned operating frequency of said power oscillator, a reference source of constant frequency, means for heterodyning energy from said power oscillator with energy from said variable frequency oscillator, means for heterodyning energy from said reference source with energy from said variable frequency oscillator, a multi-vibrator for controlling the operation of said variable frequency oscillator and for controlling the output of said heterodyning means, means for comparing the output derived from said heterodyning means, and means for comparing the phase relation of said heterodyning output to adjust the impedance of said power oscillator circuit.

4. An automatic frequency control for a power oscillator having a variable tuned circuit comprising a variable frequency oscillator arranged to sweep a band of frequency extending below and above the assigned operating frequency of said power oscillator, a reference source of constant frequency, means for heterodyning energies from said power oscillator with energy from said variable frequency oscillator, means for heterodyning energy from said reference source with energy from said variable frequency oscillator, a multi-vibrator for controlling the operation of said variable frequency oscillator and for controlling the output of said heterodyning means, means for producing pulses from said heterodyning means outputs, means for comparing the pulses derived from said heterodyning means, and means for comparing the phase relation of said pulses to adjust the impedance of said power oscillator circuit.

5. An automatic frequency control for a power oscillator having a variable impedance tuned circuit comprising a variable frequency source arranged to sweep a frequency band from below to above the assigned operating frequency of said power oscillator, a reference source of constant frequency, means for heterodyning energy from said power oscillator with energy from said variable frequency oscillator, means for heterodyning energy from said reference source with energy from said variable frequency oscillator, an amplifier for each of said means for transmitting a selected resultant heterodyned frequency, means for periodically controlling said variable oscillator and said amplifier to produce energy pulses at the output of said amplifier, means for comparing the time relation of said pulses and for accordingly controlling the impedance of said power oscillator tuned circuit.

6. An automatic frequency control for a power oscillator having a variable tuned circuit comprising a variable frequency source arranged to sweep through a frequency band extending below and above the assigned operating frequency of said power oscillator, a reference source of constant frequency, means for heterodyning energy from said power oscillator with energy from said variable frequency oscillator, an amplifier connected to said means for transmitting a selected resultant heterodyned frequency, means for heterodyning energy from said reference source with energy from said variable frequency oscillator, an amplifier connected to said circuit means for selectively transmitting a resultant heterodyned frequency, multi-vibrator means for periodically controlling said variable oscillator and said amplifier to produce energy pulses, means for comparing the time relation of said pulses and for producing a series of other pulses having constant magnitude but of such sign dependent upon said time relations, means for integrating said latter pulses, means responsive to said integrating means for adjusting the impedance of the tuned circuit of said power oscillator.

7. An automatic frequency control for a power oscillator having a tuned output circuit comprising a variable frequency oscillator arranged to sweep through a frequency band extending below and above the assigned operating frequency of said power oscillator, a reference source of constant frequency, means for heterodyning energy from said power oscillator with energy from said variable frequency oscillator, an amplifier for a selective resultant heterodyned frequency, means for heterodyning energy from said reference source with energy from said variable frequency oscillator, an amplifier for a selective resultant heterodyned frequency therefrom, multi-vibrator means for periodically controlling said variable oscillator and said amplifier to produce energy pulses, a flip-flop circuit controlled by said multi-vibrator and one of said amplifiers, a pair of control devices controlled by said flip-flop circuit and the other of said amplifiers, and means controlled by said control device for adjusting the impedance of a tuned circuit of said power oscillator.

8. An automatic frequency controlled system for a power oscillator comprising a variable frequency oscillator arranged to periodically sweep a band of frequencies, a constant frequency oscillator, a heterodyned mixer energized from said power oscillator and said variable frequency oscillator, a crystal filter circuit connected with said mixer, a second heterodyned mixer energized from said constant frequency oscillator and said variable frequency oscillator, a crystal filter circuit connected to said second mixer, a plurality of coincidence mixer gate circuit controlled by said filter circuits, means for integrating the output of said mixer gate circuits to control the frequency of said power oscillator.

9. An automatic frequency control system for a power oscillator comprising a variable frequency oscillator arranged to periodically generate a band of frequencies, a constant frequency oscillator, a heterodyned mixer energized from said power oscillator and said variable frequency oscillator, means for transmitting a selected frequency therefrom, a second heterodyned mixer energized from said constant frequency oscillator and said variable frequency oscillator, means for transmitting a selected frequency therefrom, a plurality of coincidence mixer gate circuit controlled by said selective transmission means, and means for integrating the output of said mixer gate circuit to control the frequency of said power oscillator.

10. An automatic frequency control system for a power oscillator comprising a variable frequency oscillator arranged to periodically sweep through a range of frequencies extending on either side of the assigned frequency for the power oscillator, a constant frequency oscillator, a heterodyned mixer energized from said power oscillator and said variable frequency oscillator, means connected to said mixer for transmitting a selected frequency therefrom, a second heterodyned mixer energized from said constant frequency oscillator and said variable frequency oscillator, means connected thereto for transmitting a selected frequency therefrom, a multivibrator for controlling the operation of said variable frequency oscillator and said selective transmitting means, means responsive to different time relations between the output of said selective transmitting means including a plurality of coincidence mixer gate circuit controls by said selective transmitting means, means for integrating the output of said mixer gate circuit, and a servo system responsive to said output integrating means.

11. An automatic frequency control system for a power oscillator having a tuned circuit comprising a variable frequency oscillator arranged to periodically sweep a range of frequencies extending above and below the assigned frequency for the power oscillator, a constant frequency oscillator, a heterodyned mixer energized from said power oscillator and said variable frequency oscillator, amplifying means connected to said heterodyned mixer for transmitting a selected frequency, a second heterodyned mixer energized from said constant frequency oscillator and said variable frequency oscillator, amplifier means connected to second mixer for transmitting a selected frequency, a multi-vibrator for controlling the operation of said variable frequency oscillator and said amplifier means, means for producing from the output of each amplifier means energy pulses, discriminator means responsive to different time relations between said pulses including a plurality of coincidence mixer gate circuits, means for integrating the output of said mixer gate circuits, and a servo system responsive to said output integrating means for controlling the tuned circuit of said power oscillator.

JACK WESLEY LOWER.

No references cited.